United States Patent [19]

Bokil et al.

[11] Patent Number: 4,481,708

[45] Date of Patent: Nov. 13, 1984

[54] REDUCED INTERNAL TEMPERATURE TECHNIQUE FOR HERMETIC SEALING OF ENCLOSURES

[75] Inventors: Delip R. Bokil, Winchester, Mass.; Tanjore R. Narasimhan, Salem, N.H.

[73] Assignee: Analog Devices, Inc., Norwood, Mass.

[21] Appl. No.: 340,230

[22] Filed: Jan. 18, 1982

[51] Int. Cl.³ .................... H01L 21/48; H01L 23/08; B65D 7/28; B23K 1/06

[52] U.S. Cl. .............................. 29/588; 174/52 FP; 219/85 BA; 219/85 BM; 357/81

[58] Field of Search ............... 29/588, 589; 174/52 H, 174/52 FP, 85 BM; 219/85 BA, 339, 347, 349, 350; 65/43, 58

[56] References Cited

U.S. PATENT DOCUMENTS

| | | | |
|---|---|---|---|
| 3,283,124 | 1/1966 | Kawecki | 219/349 |
| 3,404,215 | 10/1968 | Burks et al. | 65/58 |
| 3,683,146 | 8/1972 | Nugent et al. | 219/349 |
| 3,937,388 | 2/1978 | Zimmerman | 29/588 |
| 4,291,815 | 9/1981 | Gordon et al. | 29/588 |

FOREIGN PATENT DOCUMENTS 45-4144  2/1970  Japan ..................................... 29/588

Primary Examiner—Aaron Weisstuch
Assistant Examiner—Hunter L. Auyang
Attorney, Agent, or Firm—Parmelee, Bollinger & Bramblett

[57] ABSTRACT

A technique for enclosing microelectronic circuit elements in hermetically sealed packages comprising a planar ceramic substrate with a box-like ceramic cover sealed thereto by a fused glass coating. The glass sealant is applied to the substrate in the form of a paste which thereafter is fired at high temperature and cooled to produce a smooth glass coating. With the cover in place on the substrate, the glass coating is remelted by heat developed by infra-red radiation impinging on all sides of the package structure from heaters in an infra-red furnace. A reflective shield on top of the cover reduces the inflow of heat through that surface, and a heat sink beneath the substrate removes heat, thereby to reduce the temperature rise experienced by circuit elements in the package interior.

5 Claims, 5 Drawing Figures

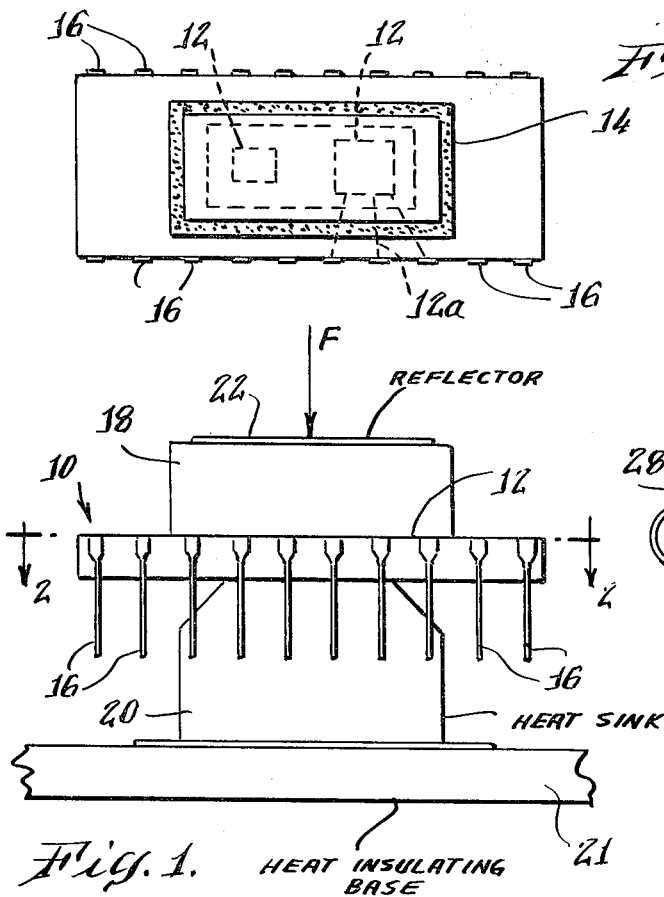
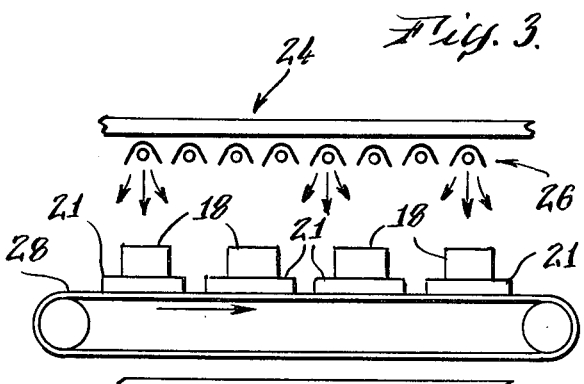
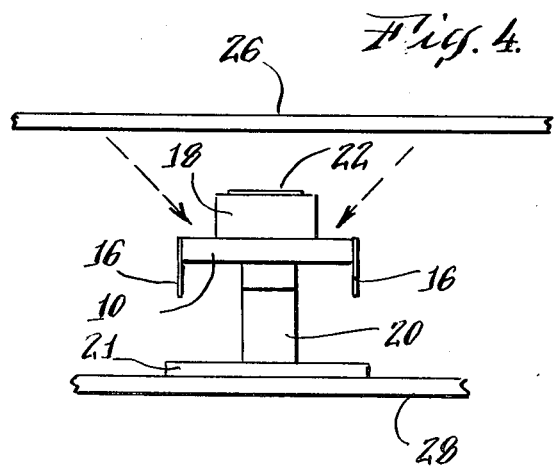
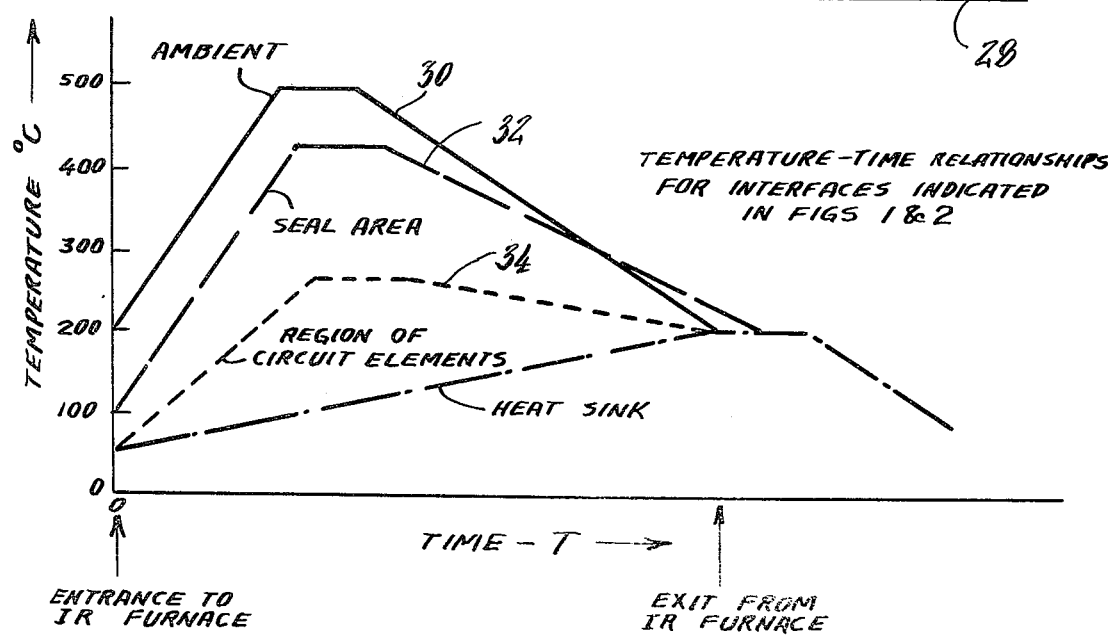

REDUCED INTERNAL TEMPERATURE TECHNIQUE FOR HERMETIC SEALING OF ENCLOSURES

BACKGROUND OF THE INVENTION

1. Field of the Invention

This invention relates to the packaging of temperature-sensitive microelectronic devices including semiconductors and hybrid integrated circuits and the like. More particularly, this invention relates to improved packaging techniques capable of producing hermetically sealed packages with a relatively low rise in the interior package temperature, thereby assuring that the enclosed circuitry is not damaged by heat. In the package to be described, the circuit elements are fabricated on a planar ceramic substrate with a rimless four-sided cover sealed thereto by means of a fused glass frit sealing compound.

2. Description of the Prior Art

A variety of ways have been developed for packaging microelectronic elements. Packaging of IC chips commonly includes the use of conduction-convection or IR furnaces to heat the package components to sealing temperature. The high interior package temperatures that result from use of such a furnace do not injure IC chips which already have been subjected to high-temperature processing including annealing. Such high interior temperatures however are not acceptable for packaging certain other types of microelectronic devices which are quite temperature-sensitive, particularly those incorporating hybrid integrated circuitry, and involving components which are mounted using organic adhesives. Thus, there has been a need for a commercially satisfactory packaging technique which does not raise the internal package temperature significantly, thereby to avoid damage to temperature-sensitive circuit elements.

Prior attempts have been made to solve this problem. For example, reference may be made to Zimmerman U.S. Pat. No. 3,973,388 which shows (see FIGS. 6c–6f) a heater core 58 arranged to be moved into a position surrounding the package lid to apply heat directly by conduction to the rim of the lid. Heat transferred through this rim melts solder which seals the lid to the substrate. Zimmerman provides heat sinks engaged with both the lid and the base to carry off heat with the objective of preventing the interior temperature from rising so high as to damage the packaged circuit elements.

The Zimmerman approach presents a number of problems. First, it is not clear that the package interior will not in practice reach excessively high temperatures for many commercial applications, particularly since the heater core closely surrounds the entire lid and will transfer heat throughout the side wall areas of the lid during the sealing process. Also, the heat is applied only to one side of the interface junction, and proper heating of the solder can be interfered with by camber of the sealing surfaces of either the lid or the base. Moreover, the Zimmerman scheme requires that the lid preferably have a rim, which undesirably takes up valuable space and moreover is difficult to construct with certain types of advantageous materials such as ceramic. In addition, the described technique is not well suited for cost-effective, mass production of electronic components.

Accordingly, it is an object of this invention to provide improved packaging techniques for microelectronic devices. A further object of the invention is to provide a packaging technique, and packages produced thereby, offering hermetic sealing of temperature-sensitive circuit elements with reduced internal temperature during the sealing procedure. Other objects, aspects and advantages of the invention will in part be pointed out in, and in part apparent from, the following description of a preferred embodiment considered together with the accompanying drawings.

SUMMARY OF THE INVENTION

In a preferred embodiment of the present invention, to be described hereinafter in detail, microelectronic circuit elements are fabricated on a ceramic substrate and hermetically protected by a ceramic box-like cover sealed to the substrate by a glass frit fused to both the substrate and the cover at the interface therebetween. In this embodiment, the substrate is prepared for sealing by screen-printing a paste-like glass frit compound along a rectangular path surrounding the region to carry the microelectronic elements. This glass frit is fired at high temperature and cooled to provide a smooth glass coating. The microelectronic circuit elements then are fabricated on the substrate, and the ceramic cover is placed in position over these elements to complete the package structure.

Infra-red radiation then is directed towards the assembled package structure. This radiation is arranged to impinge upon all of the regions adjacent the interface between the substrate and the cover and heats up those regions rapidly to remelt the glass coating and cause it to flow into and/or chemically bond with the ceramic material of the substrate and the cover. A reflective shield is placed over the cover to reduce heat transfer into the package interior. The substrate is placed on a heat sink to remove excess heat from the package interior, to avoid excessive temperatures which might damage the heat sensitive components. After the glass sealant has cooled down, the package is hermetically sealed.

BRIEF DESCRIPTION OF THE DRAWINGS

FIG. 1 is a diagrammatic showing of a package comprising a substrate and cover, mounted in a fixture in preparation for carrying out a sealing procedure in accordance with this invention;

FIG. 2 is a horizontal section taken along line 2—2 of FIG. 1, and also showing the outline of the seal area;

FIG. 3 is a vertical section showing the interior of an IR furnace, with packages being irradiated as they move through the furnace on a conveyor belt;

FIG. 4 is an end view of the package structure in the fixture; and

FIG. 5 is a graph showing the variation in temperature at selected locations in the substrate/cover package structure during the sealing procedure.

DESCRIPTION OF THE PREFERRED EMBODIMENT

Referring now to FIGS. 1 and 2, there is shown a rectangular ceramic substrate 10 adapted to support microelectronic circuit elements as illustrated at 12. Before these circuit elements are placed or fabricated on the substrate, conductors (not shown) in accordance with the particular circuit design are applied to the substrate surface by conventional thick-film techniques. Thereafter, the substrate receives an application of a sealing compound throughout a rectangular sealing area as indicated at 14, crossing over the portions of the already-applied conductors which are to make connections to the external pins 16 of the completed package, such conductor portions being schematically illustrated at 12a.

This sealing compound preferably is in the form of a paste-like glass frit which is screened or "painted" onto the substrate as by means of a conventional thick-film screen and printing machine (not shown). The substrate then receives a drying and air-firing treatment (e.g. 420° C. for 20 minutes), to burn off all of the organic components and to produce a smooth glass coating over the entire sealing area 14.

The microelectronic circuitry 12 then is placed or fabricated on the prepared substrate in known fashion, e.g. including conventional screen printing of organic adhesive and placement of circuit elements thereon. Appropriate connections are made to the already-applied conductors including those portions 12a leading to the pins 16. The fully-fabricated substrate then is electrically tested to assure compliance with pertinent specifications. If the unit is satisfactory, a four-sided ceramic cover 18 is placed on the substrate, and the assembled package structure is installed in a fixture comprising a heat sink 20 for the substrate. A reflector 22 also is placed on top of the cover, and held in place by a moderate force F applied in any conventional fashion. The lower surfaces of the cover side walls are aligned with and contact the fired glass coating 14 on the substrate and the package fixture is supported on a heat insulating base 21.

Such fixtures with assembled package structures are passed through a conventional IR furnace 24 having the usual set of IR heat sources in the roof. A conveyor belt 28 carries the fixtures through the furnace. Radiation is applied simultaneously to all the sides of the package components, including the side regions adjacent the interface between the substrate 10 and the cover 18. The reflector 22 shields the top of the cover 18 from the heating effects of the radiation. This reflector may for example be a ceramic plate coated with a shiny layer of polished gold. The heat sink 20 removes excess heat from the package interior.

The radiant heat energy in accordance with this invention strikes both the sides of the cover 18 and the upper surface of the substrate 10 adjacent the glass coating, i.e. in the regions above and below the interface. The radiation in effect comes from all around the package structure, impinging upon all sides thereof. As shown in FIG. 4, the radiant heaters 26 extend out laterally substantially beyond the long sides of the package. Heat energy absorbed by both package components is transferred directly to the glass coating 14, which softens and remelts. This sealing procedure preferably is carried out in a moisture-free, inert gas atmosphere, such as nitrogen, to assure optimum hermetic sealing.

The speed of movement through the IR furnace is set so that the infra-red radiation will fully remelt the glass coating 14 and provide for fusion and/or chemical bonding between the glass and the adjacent package components before or just as the package exits the furnace. After the package exits, the heated parts cool and the glass hardens. The resulting completed package provides long-lived true hermetic sealing of the interior elements, since the ceramic and glass package components all are sturdy and non-permeable.

Referring now to the temperature vs. time graph of FIG. 5, it will be seen that the sealing procedure in accordance with this invention is well adapted to reducing the rise in interior package temperatures. The upper curve 30 represents the ambient temperature of the atmosphere in the furnace, which reaches a peak of about 500° C. The next curve 32 represents the temperature of the seal areas, i.e. the interface between the substrate 10 and the cover 18, and shows that the glass frit sealant temperature reached a maximum of about 430° C. during the sealing procedure. The next curve 34 represents the interior temperature in the region where the temperature-sensitive elements are located and shows that the temperature there did not go above about 275° C. The bottom curve 36 represents the temperature of the heat sink 20, and shows that its temperature reached about 200° C.

Although glass frit paste is described hereinabove as being applied only to the substrate 10, it will be understood that for some products it may be advantageous to also/only apply the glass frit to the lower surfaces of the cover 18, followed by air-drying and firing as described. Such dual glass coatings will provide an advantageous amount of melt, which may be useful for certain types of package constructions; whereas a single glass coating on the cover sealing surfaces will be necessary where prescreening of the glass frit on the substrate is not practicable.

The ceramic material preferably is black, 91–92% alumina, and may be obtained from the Kyocera Corporation. The vitreous glass frit preferably is applied in the form of a paste consisting of milled particles of vitreous glass, binders and solvents. Vitreous glass may be obtained from Technology Glass Corporation, under their No. LS 0803.

The prior art contains extensive disclosures of apparatus and techniques for developing infra-red radiation, and for controlling its application to specified regions. Accordingly, no detailed showing of such apparatus is included in this application. By way of example, however, reference may be made to U.S. Pat. Nos. 3,374,531; 3,586,813; 3,661,369; 3,718,800; 3,836,745; and 3,879,164. These patents generally relate to means for soldering connections, and none teaches the present reduced-temperature packaging technique, nor the superior package produced by this technique.

One especially advantageous application of this invention is in packaging the microelectronic components of a hybrid isolation amplifier, e.g. including circuitry as disclosed in U.S. Pat. No. 4,286,225. The non-conductive nature of the ceramic and glass package elements eliminates problems which otherwise would be encountered in assuring adequate conductive isolation, freedom from high-voltage arcing, and operation in the presence of high common mode voltage, e.g. as high as ±8000 volts in some cases.

Although a preferred embodiment of this invention has been described hereinabove in detail, it is desired to emphasize that this has been for the purpose of illustrating the invention, and should not be considered as necessarily limitative of the invention, it being understood that many modifications can be made by those skilled in the art while still practicing the invention disclosed herein.

We claim:

1. The method of packaging temperature-sensitive microelectronic devices, including hybrid integrated circuits, supported on a rigid hermetic planar substrate, comprising the steps of:

applying a meltable hermetic sealing material along a closed path defined by the interface between said substrate and a hermetic box-like cover surrounding the region for said microelectronic devices;

placing on said substrate said hermetic box-like cover having side walls aligned with and contacting said sealing material completely around said closed path;

directing infra-red radiation towards both said substrate and said cover from all sides thereof, said radiation striking the regions of both said cover and said substrate which are adjacent the interface therebetween;

shielding the top surfaces of said cover by means reflecting the radiation directed towards said top surfaces;

withdrawing heat from the lower surfaces of said substrate by heat sink means;

said radiation being applied simultaneously to all sides of the package structure for a time sufficient to melt said sealing material and to provide for fusion and/or bonding thereof with said substrate and said cover; and removing said infra-red radiation to permit the melted sealing material to cool in a fused and/or bonded state with both said substrate and said cover to assure effective hermetic sealing of the completed package.

2. The method of claim 1, wherein said substrate, said cover, and said sealing material are all electrically non-conductive.

3. The method of claim 2, wherein said substrate and said cover are formed of ceramic material.

4. The method of claim 3, wherein said sealing material is a glass frit.

5. The method of claim 4, wherein said glass frit first is fired at high temperature to produce a smooth glass coating in the areas to be sealed;

said substrate being free of temperature-sensitive devices during the firing of said glass frit; and fabricating temperature-sensitive devices on said substrate before carrying out said radiation-sealing procedure.

* * * * *